United States Patent
Gogolides et al.

(10) Patent No.: US 12,358,786 B2
(45) Date of Patent: Jul. 15, 2025

(54) METHODS FOR ULTRASONIC FABRICATION AND SEALING OF MICROFLUIDICS

(71) Applicants: Evangelos Gogolides, Agia Paraskevi (GR); NATIONAL CENTRE FOR SCIENTIFIC RESEARCH "DEMOKRITOS", Agia Paraskevi (GR)

(72) Inventors: Evangelos Gogolides, Agia Paraskevi (GR); Kosmas Ellinas, Agia Paraskevi (GR); George Boulousis, Agia Paraskevi (GR)

(73) Assignee: NATIONAL CENTRE FOR SCIENTIFIC RESEARCH "DEMOKRITOS", Agia Paraskevi (GR)

( * ) Notice: Subject to any disclaimer, the term of this patent is extended or adjusted under 35 U.S.C. 154(b) by 225 days.

(21) Appl. No.: 18/265,061

(22) PCT Filed: Dec. 2, 2021

(86) PCT No.: PCT/EP2021/083946
§ 371 (c)(1),
(2) Date: Jun. 2, 2023

(87) PCT Pub. No.: WO2022/117716
PCT Pub. Date: Jun. 9, 2022

(65) Prior Publication Data
US 2024/0025735 A1    Jan. 25, 2024

(30) Foreign Application Priority Data
Dec. 4, 2020 (EP) .................... 20211850

(51) Int. Cl.
*B29C 65/08* (2006.01)
*B29C 65/00* (2006.01)
(Continued)

(52) U.S. Cl.
CPC .......... *B81C 1/00357* (2013.01); *B29C 65/08* (2013.01); *B29C 66/7315* (2013.01);
(Continued)

(58) Field of Classification Search
CPC ................ B29C 65/08; B29C 66/7315; B29C 66/73921; B81C 1/00357
(Continued)

(56) References Cited

U.S. PATENT DOCUMENTS 11,364,498 B2 * 6/2022 Govyadinov ..... B01L 3/502723
2006/0235335 A1 10/2006 Elsenhans et al.
(Continued)

FOREIGN PATENT DOCUMENTS

DE    102019107090 A1    9/2020

OTHER PUBLICATIONS

Gale, et al.: "A Review of Current Methods in Microfluidic Device Fabrication and Future Commercialization Prospects," Inventions, 3, 60, (2018), pp. 1-25.
(Continued)

*Primary Examiner* — James D Sells
(74) *Attorney, Agent, or Firm* — NORTON ROSE FULBRIGHT US LLP

(57) ABSTRACT

Method of manufacturing a microfluidic device comprising an inflexible polymeric substrate, one or more flexible polymeric substrate(s) and one or more microfluidic channel(s) enclosed between the substrates comprising a) providing a master form including rim protrusions defining an enveloping shape for the microfluidic channel(s) to be produced and enclosed between the substrates, b) placing
(Continued)

one or more flexible polymeric substrate(s) each having a layer thickness of less than 800 μm onto the master form, wherein one flexible polymeric substrate is in contact with the rim protrusions of the master form, c) placing an inflexible polymeric substrate with a layer thickness of equal to or more than 800 μm onto the flexible polymeric substrate (s), and d) ultrasonically welding the one or more flexible polymeric substrate(s) and the inflexible polymeric substrate at the rim protrusions. By the inventive method microfluidic devices via ultrasonic welding without using energy directors can be obtained.

12 Claims, 12 Drawing Sheets

(51) Int. Cl.
  *B81C 1/00* (2006.01)
  *B29L 31/00* (2006.01)

(52) U.S. Cl.
  CPC ... *B29C 66/73921* (2013.01); *B29L 2031/756* (2013.01); *B81C 2201/019* (2013.01); *B81C 2203/038* (2013.01)

(58) Field of Classification Search
  USPC .......................................................... 156/73.1
  See application file for complete search history.

(56) References Cited

U.S. PATENT DOCUMENTS

| | | |
|---|---|---|
| 2008/0178987 A1 | 7/2008 | Zhou et al. |
| 2019/0168221 A1 | 6/2019 | Sollier et al. |

OTHER PUBLICATIONS

Kistrup, et al.: "Ultrasonic welding for fast bonding of self-aligned structures in lab-on-a-chip systems," Lab Chip, 15 (2015), pp. 1998-2001.

Sackmann, et al.: "Review on ultrasonic fabrication of polymer micro devices," Ultrasonics 56 (2015), pp. 189-200.

Khuntontong, et al.: "Ultrasonic micro hot embossing of polymers exemplified by a micro thermal flow sensor," Smart Systems Integration 2008: 2nd European Conf. & Exhib. on Integration Issues of Miniaturized Systems—MEMS, MOEMS, ICS & Electronic Components, (2011), IEEE Xplore, XP 055800495, pp. 1-8.

International Search Report issued in PCT/EP2021/083946 on Dec. 21, 2021.

\* cited by examiner

PMMA microfluidic channels
140 J/cm²

150 J/cm²

150 J/cm²

170 J/cm²

Figure 8 (a) PMMA
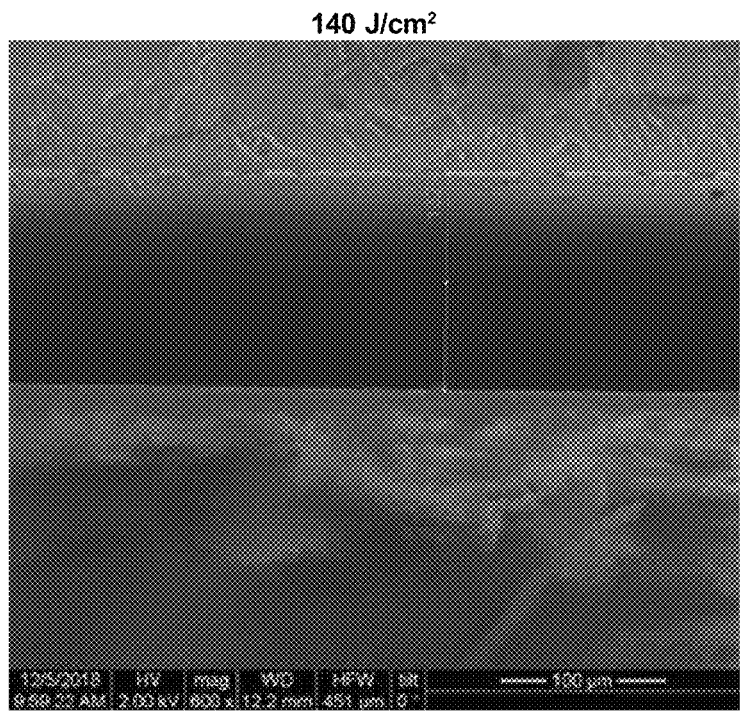
Figure 8 (b) PMMA
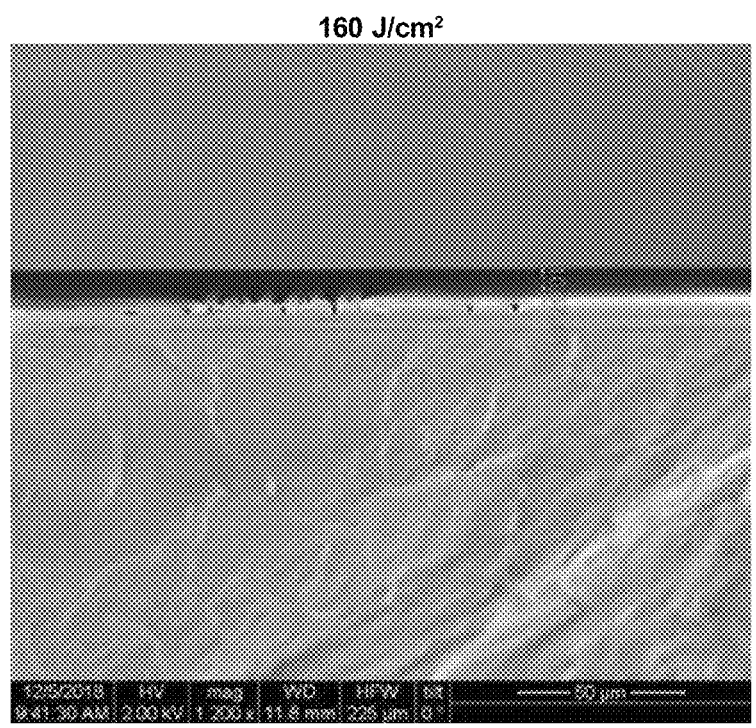

Figure 8 (c) PMMA
Low magnification image
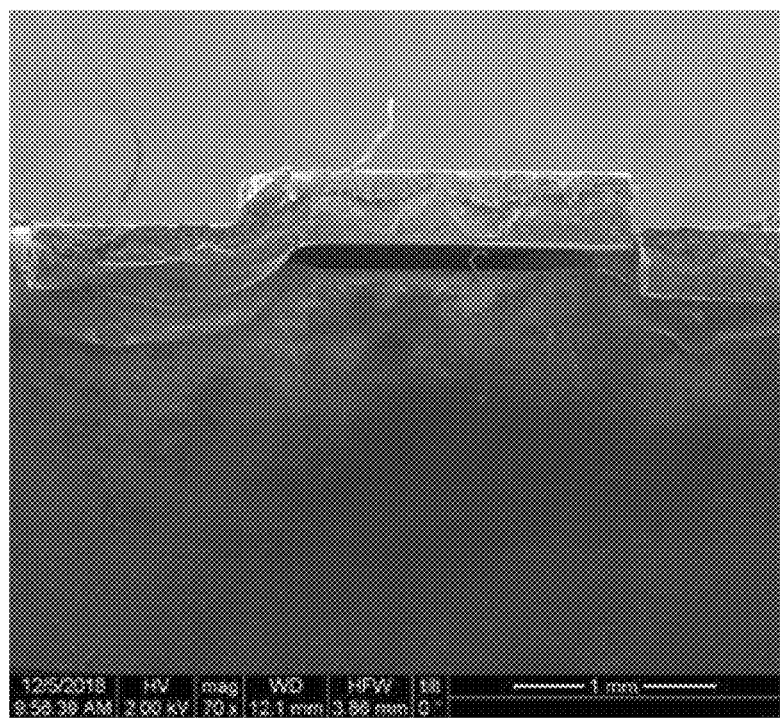

Figure 9 (a) COP
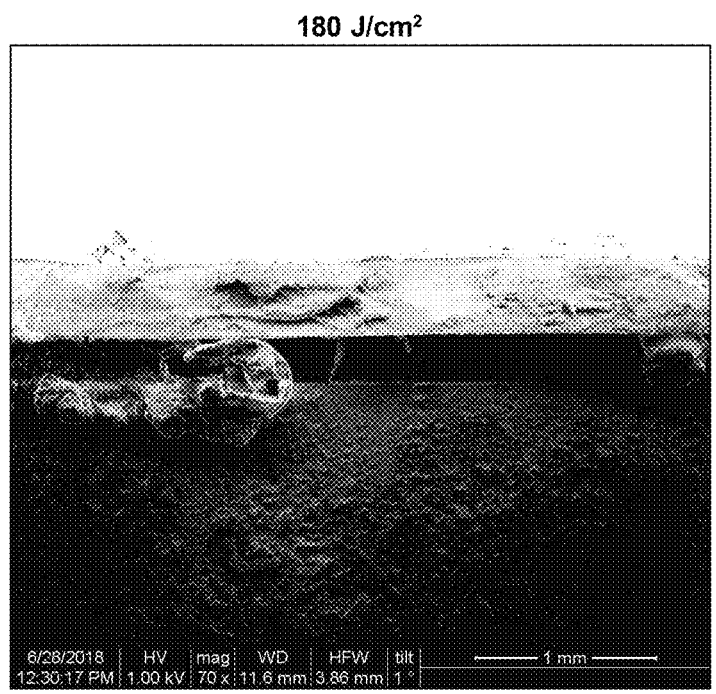
Figure 9 (b) COP
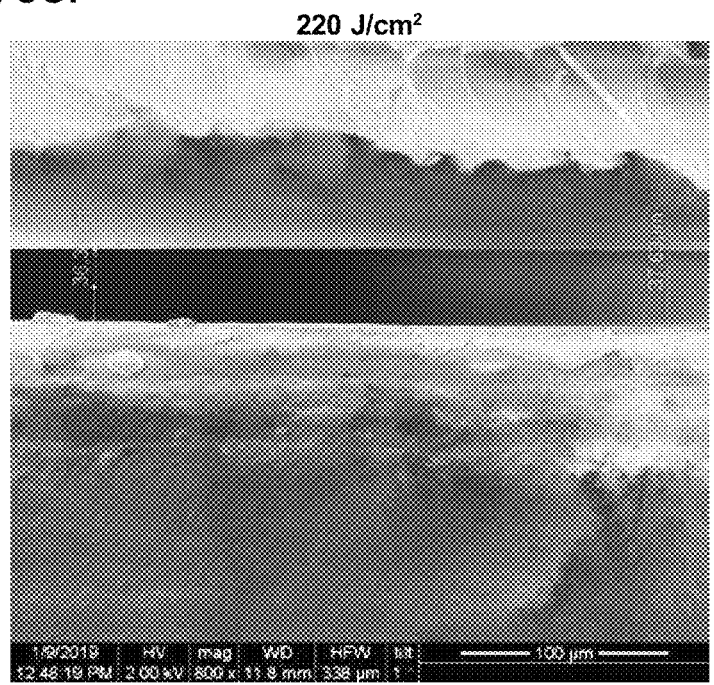

Figure 9 (c) COP
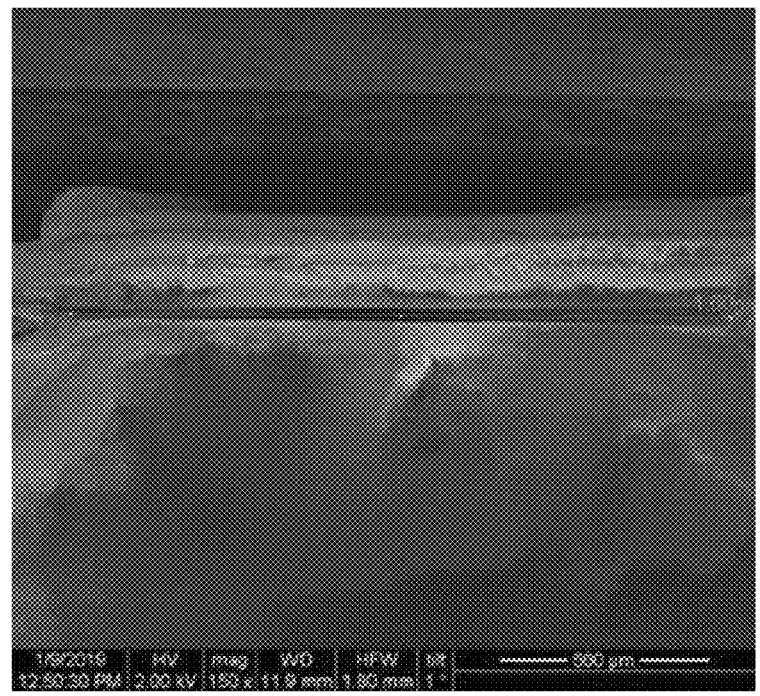

METHODS FOR ULTRASONIC FABRICATION AND SEALING OF MICROFLUIDICS

CROSS REFERENCE TO RELATED APPLICATIONS

This patent application is a national phase under 35 U.S.C. § 371 of International Patent Application No. PCT/EP2021/083946 filed Dec. 2, 2021, which claims the benefit of priority from European patent application No. 20211850.1 filed Dec. 4, 2020, each of which is hereby incorporated herein by reference in its entirety for all purposes.

FIELD OF THE INVENTION

The present invention is directed to the fabrication and sealing of microfluidic devices. The method of manufacturing microfluidic devices according to the present invention encompasses ultrasonic welding of at least two polymeric substrates without the use of energy directors.

By the method of the present invention an open, existing microfluidic channel in a polymeric substrate can be sealed, i.e. a cover or lid is placed on an open microfluidic device comprising preformed microfluidic channels without deformation, melting or clogging of the microfluidic channel. Alternatively, microfluidic channels enclosed between at least two initially flat polymeric substrates can be created. Microfluidic devices find application in life science such as point of care diagnostics, environmental monitoring, (bio) analytics, drug discovery and DNA purification or as cooling devices of mobile phones, electronic devices, etc.

BACKGROUND OF THE INVENTION

Microfluidic devices are components in miniaturized laboratories, which fit onto a micro-chip (Lab-on-a-Chip). Microfluidic devices comprise submillimeter-sized channels, which may be connected by pumps, valves and mixers for manipulating and transporting a fluid such as a liquid or gas. The network of channels, valves, pumps and mixers is connected to the outside by input and output ports. Through these holes the fluid is injected into and removed from the device via e.g. syringes and tubing. Such devices are expected to revolutionize hospital and point of care analysis, food and environmental monitoring, drug discovery and biological research. On a chip, such microfluidic devices can perform the functions of a chemical or biological laboratory. Thereby, they allow to minimize reagent and sample use and to reduce analysis time from days to minutes or even seconds.

Microfluidic devices are often made of polymeric material in order to be disposable and to accommodate a network of microfluidic channels. Usually, a substrate with open, preformed channels is provided which are then sealed by a cover or lid. At present, both fabrication and sealing of these microchannel networks is extremely costly and time-consuming. A typical thermal bonding step between the open microchannel network and a cover/lid may take as long as one hour.

While research in the field of microfluidics focusses on miniaturizing and accelerating analysis protocols on a chip, the cost issues are often overlooked. As a result, even visionary technologies such as performing rapid bacteria analysis in food or blood on a chip may not reach the state of practical use due to high costs. Contrary for example to computer phone chips, microfluidic chips need to be disposable as they are only used once. The highest costs in the production of microfluidic devices are generated in the manufacturing process thereof and not by the materials and reagents used therefor. As a result, manufacture has moved away from microelectronic chip fabrication requiring clean room fabrication to more economical approaches such as hot embossing, role-to-role embossing or injection molding (cf. B. K. Gale et al. Inventions 2018, 3, 60). Fabrication of microfluidic channels by hot-embossing via a master, which typically takes about one hour, injection molding or role-to-role embossing for larger volumes require the use of expensive master forms or molds, which are in particular time-consuming in the making (cf. Gale et al.).

Sealing of open microfluidic channels mostly relies on lamination techniques with an adhesive "tape"-like lamination film. Often, the lamination film is of a different material than the substrate comprising the open microfluidic channels which leads to compatibility issues and thus to incomplete and faulty sealing of the channels. For sealing of open microfluidic channels thermal or other bonding methods are known, which, however, have in common that a long time is required to achieve a single chip fabrication. This poses great obstacles for mass production of microfluidic devices.

The idea of ultrasonic processing has been proposed both for fabricating and sealing of microdevices (cf. Sackmann et al., Ultrasonics 56 (2015), 189-200). Ultrasonic treatment melts the polymeric material, in particular polymer foils, which flows over a master form having grooves and protrusions. Upon solidification and removal of the master form, a microfluidic channel is formed. However, excessive flow of material may occur during this process and often the obtained microfluidic channels are deformed. It is then even more difficult to bond a lid or cover to such a microfluidic channel without deforming or destroying it. This is because bonding a lid or cover (lamination) film onto the open, preformed microfluidic channel structure again requires heating the assembly. Thus, for sealing of microfluidic channels introduction of energy directors as protrusions on the polymer material around the microfluidic channels has been proposed. These energy directors get into contact with the lamination film first and thereby bonding of a lid is achieved. In addition to the energy directors, also microgrooves need to be present in the polymeric material to accept the superfluous melted material of the energy directors (cf. Sackmann et al., Ultrasonics 56, (2015), 189-200).

For example, Kistrup et al. Lab Chip (2015), 15(9) describes ultrasonic welding for fast bonding of self-aligned structures in lab-on-chip systems using energy directing structures for sealing a main chip part with a foil. However, this method requires the complex and time-consuming manufacture of custom mold inserts for the injection molder comprising the energy directing structure.

Alternatively, solvent bonding assisted by ultrasonics has been proposed. For example, US 2008/0178987 A1 discloses laminating two or more layers of a microfluidic structure by means of a weak solvent bonding agent. However, this technique requires the use of potentially hazardous solvents such as acetonitrile.

Thus, there is a great need for fast, reliable and microscale accurate technologies for fabricating microfluidic devices with flexible network design to allow for a widespread application of microfluidic devices, in particular in point of care analysis, food and environmental monitoring, drug discovery, biological research and as cooling devices in electronics.

The present invention provides a method of manufacturing a microfluidic device via ultrasonic welding without using energy directors, wherein fabrication of closed microfluidic channels of varying structures only takes a few seconds. Thereby, the manufacturing process is rendered more economic than those described in the art. Furthermore, by the method of the present invention, it is possible to fabricate microfluidic devices having at the top and bottom of the microfluidic channels the same material, i.e. for example sealing open, preformed microfluidic channels indented into a polymeric substrate material with the same polymeric material as the substrate material. Thereby compatibility problems between the substrate comprising open microfluidic channels and the lamination film serving as lid or cover material are overcome.

SUMMARY OF THE INVENTION

The present invention provides a method of manufacturing a microfluidic device comprising an inflexible polymeric substrate, one or more flexible polymeric substrate(s) and one or more microfluidic channel(s) enclosed between the substrates. The method comprises a) providing a master form including rim protrusions which define an enveloping shape for the one or more microfluidic channel(s) to be produced and enclosed between the substrates, b) placing one or more flexible polymeric substrate(s) each having a layer thickness of less than 800 μm onto the master form, wherein one flexible polymeric substrate is in contact with the rim protrusions of the master form, c) placing an inflexible polymeric substrate with a layer thickness of equal to or more than 800 μm onto the one or more flexible polymeric substrate(s), and d) ultrasonically welding the one or more flexible polymeric substrate(s) and the inflexible polymeric substrate at the positions of the rim protrusions.

The inflexible polymeric substrate may include one or more preformed microfluidic channels which may be sealed by ultrasonically welding the inflexible polymeric substrate with the flexible polymeric substrate in step d).

Thereby, the open, preformed microfluidic channels are provided with a cover or lid to provide closed microfluidic channels. Alternatively, in step d), the flexible polymeric substrate is simultaneously to being welded to the inflexible polymer substrate deformed to create a bulging microfluidic channel enclosed between the inflexible polymeric substrate and the flexible polymeric substrate.

By the method of the present invention, also a microfluidic device comprising multilayered microfluidic channels can be obtained.

BRIEF DESCRIPTION OF THE DRAWINGS

FIGS. 8(a) and (b) show SEM images of cross sections of a rapidly created bulging microfluidic channel for PMMA. An SEM Low magnification image is also provided, showing the channel cross-section (FIG. 8(c)).

FIGS. 9(a) and (b) show SEM images of cross sections of a rapidly created bulging microfluidic channel for COP. An SEM Low magnification image is also provided, showing the channel cross-section (FIG. 9(c)).

DETAILED DESCRIPTION OF THE INVENTION

Figure 1:
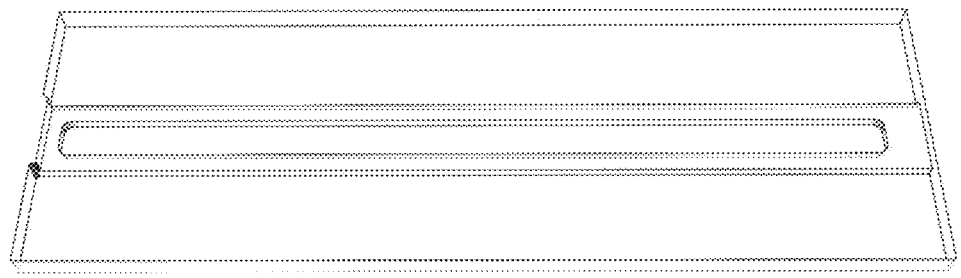
FIG. 1 shows an exemplary metallic master form used in the method of the present invention.

The present application provides a method for fabricating and sealing microfluidic channels enclosed between polymeric substrates. Microfluidic channels are in the submillimeter-size range and are made to accommodate amounts of fluid such as liquid or gas in the appropriate amounts for microfluidic devices (usually in the range of microliters). The microfluidic device comprises one or more flexible polymeric substrate(s) each having a layer thickness of less than 800 μm and an inflexible polymeric substrate which is thicker than the flexible polymeric substrate, i.e. has a layer thickness equal to or more than 800 μm.

The inflexible polymeric substrate preferably has a layer thickness of from 1000 μm (1 mm) to 4000 μm (4 mm), or from 1500 μm (1.5 mm) to 3000 μm (3 mm). Even more preferred is a thickness of the inflexible polymeric substrate of from 1800 μm (1.8 mm) to 2400 μm (2.4 mm). The thickness defines the material as inflexible. The inflexible polymeric substrate may comprise a thermoplastic polymer. The thermoplastic polymer may be poly(methyl methacrylate) (PMMA), cyclo olefin-copolymer (COC), cyclo olefin polymer (COP), polystyrene (PS), polyether ether ketone (PEEK), fluorinated ethylene propylene (FEP), polypropylene (PP), polyethylene (PE) and polycarbonate (PC). Preferably, the inflexible polymeric substrate comprises PMMA or COP. The inflexible polymeric substrate may be a sheet. The inflexible polymeric substrate may be flat prior the ultrasonic welding step d). The term flat substrate in the context of the application shall relate to a substrate having no (open) indentions such as for example unsealed, preformed microfluidic channels. Alternatively, the inflexible polymeric substrate may also comprise preformed microfluidic channels which are indented in the polymeric substrate. The preformed microfluidic channels may be open or may be enclosed in the inflexible polymeric substrate. The shape of the preformed microfluidic channels is preferably rectangular, but may also have another shape.

The one or more flexible polymeric substrates preferably have a layer thickness of between 50 μm and 800 μm or between 100 μm and 500 μm. Even more preferred is a thickness of the flexible polymeric substrate of between 150 μm and 350 μm. The one or more flexible polymeric substrate may comprise a thermoplastic polymer. The thermoplastic polymer may be poly(methyl methacrylate) (PMMA), cyclo olefin-copolymer (COC), cyclo olefin polymer (COP), polystyrene (PS), polyether ether ketone (PEEK), fluorinated ethylene propylene (FEP), polypropylene (PP), polyethylene (PE) and polycarbonate (PC). Preferably, the one or more flexible polymeric substrates comprises PMMA or COP. The one or more flexible polymeric substrates preferably are a sheet or a foil. Preferably, the one or more flexible polymeric substrates are flat prior the ultrasonic welding step d).

Preferably, the inflexible polymeric substrate and the one or more flexible polymeric substrates are made of the same thermoplastic polymer. Preferably, the inflexible polymeric substrate and the one or more flexible polymeric substrates are made of PMMA or COP. In particular, when the inflexible polymeric substrate includes preformed microfluidic channels and the flexible polymeric material is used to seal the open, preformed microfluidic channels in the inflexible polymeric material it is advantageous when the inflexible polymeric substrate is of the same chemical composition as the flexible polymeric material, i.e. the lid or cover material. Thereby, chemical compatibility problems are avoided.

In the method of the present invention, a master form is provided including rim protrusions (step a)). These rim protrusions define the boundaries, i.e. the spatial limitations for the one or more microfluidic channels enclosed between the substrates to be created by the method of the present invention. Alternatively, the rim protrusions are circumferentially positioned around the preformed microfluidic channel to be sealed and enclosed between the substrates. The boundaries or spatial limitations of the rim protrusions are also referred to as having an enveloping shape. The rim protrusions of the master form may have a width of from 50 to 2200 µm (0.05 to 2.2 mm) and preferably from 50 to 2000 µm (0.05 to 2.0 mm). In an alternative preferred embodiment, rim protrusions having a width in the range of 1000 to 2200 µm (1.0 to 2.2 mm), preferably in the range of 1800 to 2200 µm (1.8 to 2.2 mm), more preferably in the range of 1900 to 2100 µm (1.9 to 2.1 mm) and most preferably of 2000 µm (2.0 mm) particularly allow for a homogeneous distribution of ultrasonic energy, whereby accurate formation of microfluidic channels with no or hardly any deformation is ensured. The rim protrusions may have a height of from 100 to 1000 µm, preferably from 500 to 800 µm.

The master form needs to be of a material with large heat conductivity and heat capacity enabling quick cooling after the ultrasonic welding process. Consequently, the master form comprises a metallic material such as aluminum or copper. The metallic master form comprising the rim protrusions may be fabricated for example by Computer Numerical Control (CNC) micromilling. An example of a metallic master form with the metallic rim protrusions on which the flexible polymeric foil substrate sits allowing ultrasonic welding at the rim position is shown in FIG. 1. The microfluidic channels are created in the space between the rim protrusions, or sealed at the position of the rim protrusions if preformed microfluidic channels are present in the inflexible polymeric substrate.

Following the provision of a master form including rim protrusions, one or more flexible polymeric substrates are placed onto the master form, wherein one flexible polymeric substrate is in contact with the rim protrusions of the master form (step b)). The flat, flexible polymeric substrate contacts the rim protrusions of the master form where it touches the rim protrusions. The space defined by the enveloping shape of the master form, i.e. the space surrounded by the rim protrusions is not in contact with the flexible polymeric substrate and thus does not touch the rim protrusions. Optionally, further flexible polymeric substrates may be placed onto the flexible polymeric substrate which is in contact with the rim protrusions of the master form.

Figure 2:
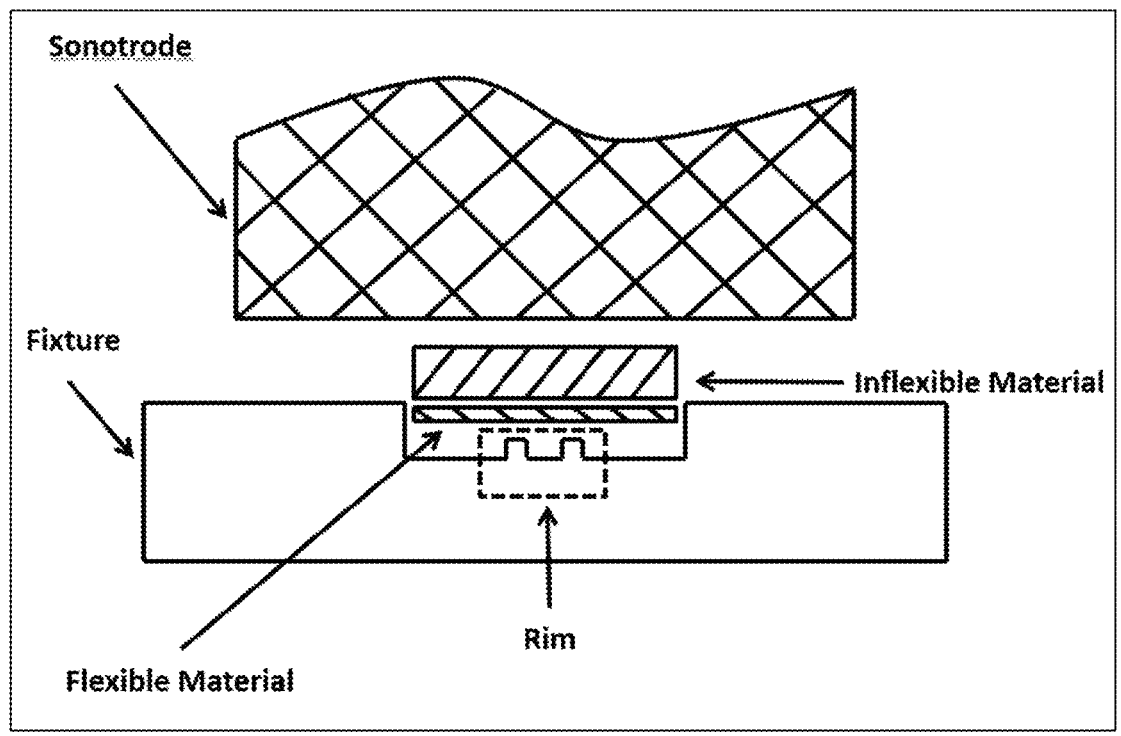
FIG. 2 schematically shows an ultrasonic welding apparatus as used in the present invention.

Then, an inflexible polymeric substrate is placed onto the one or more flexible polymeric substrate(s) (step c)). The substrates may be fixed in an apparatus as shown in FIG. 2.

Figure 3:
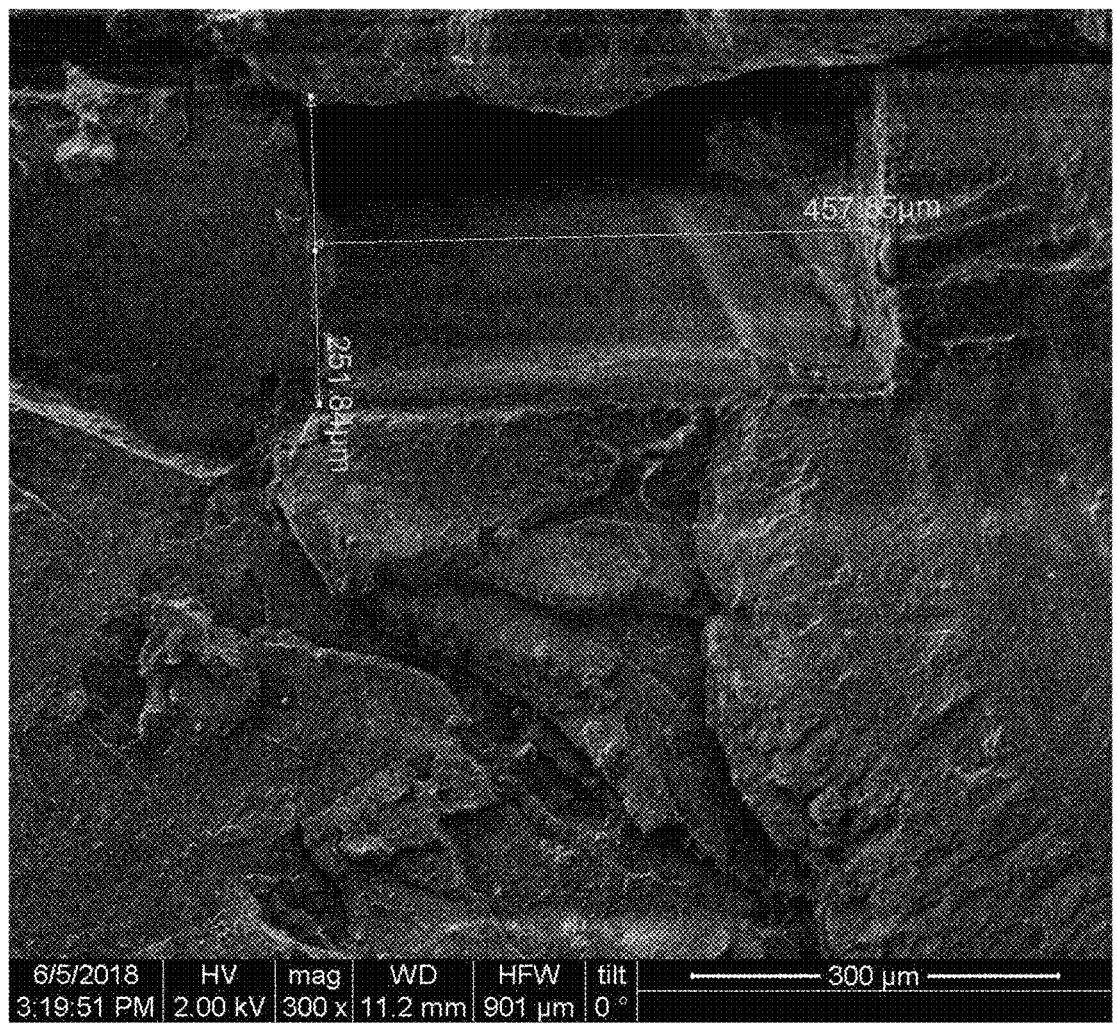
FIG. 3 shows the cross section of an ultrasonically sealed preformed microfluidic channel having a width of about 458 μm and a height of about 252 μm using acrylic polymer substrates.
Figure 4:
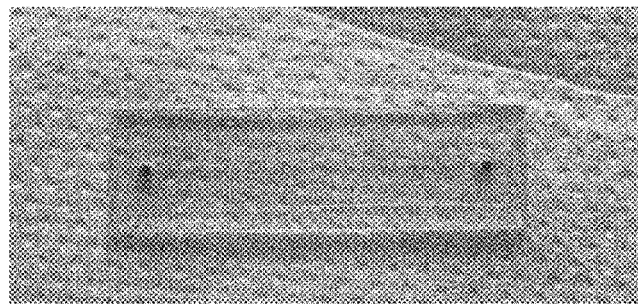
FIG. 4 shows a microfluidic device made of cyclo olefin polymer (COP) which was ultrasonically sealed with a cyclo olefin polymer (COP) foil.

In the next step (step d)), the inflexible polymeric substrate and the one or more flexible polymeric substrates are ultrasonically welded at the rim protrusions. Thus, at the rim protrusions a bond in the form of a weld between the inflexible polymeric substrate and the flexible polymeric substrate is formed to obtain microfluidic channels enclosed between the inflexible polymeric substrate and the flexible polymeric substrate. In FIG. 3 the cross section of an ultrasonically sealed preformed microfluidic channel having a width of about 458 µm and a height of about 252 µm using PMMA polymer substrates is shown. In FIG. 4 a microfluidic device made of cyclo olefin polymer (COP) which was ultrasonically sealed with a cyclo olefin polymer (COP) foil is shown. The microfluidic channel shown in FIG. 4 is 100 µm deep, i.e. has a height of 100 µm and is filled with colored water.

If two or more flexible polymeric substrates are used in the method of the present invention, a bond between two flexible polymeric substrates may additionally be formed, whereby a microfluidic channel is created enclosed between two flexible polymeric substrates.

In one embodiment of the present invention, the inflexible polymeric substrate includes one or more preformed microfluidic channels which are sealed by ultrasonically welding a flexible polymeric substrate and the inflexible polymeric substrate at the positions of the rim protrusions of the master form (step d)). Thus, preformed microfluidic channels are provided with a lid or cover of the flexible polymeric material to provide microfluidic channels which are enclosed between the inflexible polymeric substrate and the flexible polymeric substrate. The ultrasonic welding in step d) of the two substrates may even be performed when the preformed microfluidic channels are already filled with liquid.

By controlling the conditions during the ultrasonic welding process complete sealing with a flexible polymeric substrate of preformed microfluidic channels is achieved without deformation or destruction of the preformed microfluidic channel and without the use of energy directors in the inflexible polymeric substrate. Thereby, use and fabrication of much less complex master forms is possible. This in turn is cost and time effective.

The inflexible polymeric substrate including the one or more open, preformed microfluidic channels can be fabricated by any means of polymer patterning method such as Computer Numerical Control (CNC) milling, lithography, lithography and dry etching, hot embossing and injection molding.

In an alternative embodiment of the present invention, microfluidic channels are created in the ultrasonic welding step d). During the ultrasonic welding the flexible polymeric substrate is simultaneously deformed and thereby creates a bulging microfluidic channel. Thus, at the same time the bonding of the substrates at the rim protrusions takes place, the flexible polymeric substrate by means of the heat and the mechanical stress generated during the ultrasonic welding step deforms into the cavity of the master form defined by the boundaries of the rim protrusions. Thereby, a void is created which defines the microfluidic channel. In other words, the flexible polymeric substrate bulges within the dimensions of the master form and thereby creates a microfluidic channel enclosed between the inflexible polymeric substrate and the flexible polymeric substrate. By controlling the conditions during the ultrasonic welding process and by the geometry of the rim protrusions, the dimensions of the microfluidic channel can be determined.

Ultrasonic welding is a technique wherein high-frequency ultrasonic acoustic vibrations are locally applied to substrates which are held together under pressure whereby a solid-state weld is created. In the ultrasonic welding process, the parts to be joined, i.e. welded, are sandwiched between a fixed structure (anvil) and a sonotrode connected to a (piezoelectric) transducer. An electronic ultrasonic generator or power supply generates a high-power electric signal which is transmitted to the transducer whereby ultrasonic acoustic vibrations are generated. Common frequencies used in ultrasonic welding of thermoplastic polymers are between 15 kHz to 70 kHz. In FIG. 2 an apparatus for use in the present invention is schematically shown. The flexible polymeric material (1) is placed in a fixture (2) corresponding to or comprising the master form with the rim protrusions (3) having an enveloping shape. The inflexible polymeric substrate (4) is then placed onto the flexible polymeric material (1) beneath a sonotrode (5).

The ultrasonic welding in step d) may be carried out with a frequency of between 20 to 40 kHz, preferably of between 30 to 35 kHz. Further, the sonotrode force and the resulting pressure for pressing the polymeric substrates together is between 150 and 650 N/cm² of rim area, preferably between 200 and 500 N/cm² of rim area, or between 300 and 450 N/cm² of rim area. The total (ultrasonic) energy used in the ultrasonic welding process is between 50 and 500 J/cm² of rim area, preferably between 150 and 400 J/cm² of rim area. The amplitude during ultrasonic welding of the polymeric substrates is between 5 to 14 µm, preferably between 7 to 14 µm, and more preferably between 8 to 10 µm. The most important parameters regarding ultrasonic welding in the present invention are total (ultrasonic) energy per unit of rim area, amplitude and sonotrode force per unit of rim area.

The ultrasonic welding conditions are adapted based on the polymeric material used. For example, if poly(methyl methacrylate) (PMMA) is used for the inflexible and flexible polymeric material the total energy is preferably between 140 and 160 J/cm² of rim area, the amplitude is preferably between 9 and 10 µm and the sonotrode force is preferably between 400 and 500 N/cm² of rim area. If cyclo olefin polymer (COP) is used for the inflexible and flexible polymeric material the total energy is preferably between 160 and 200 J/cm² of rim area, the amplitude is preferably between 8.5 and 9.5 µm and the sonotrode force is preferably between 350 and 400 N/cm² of rim area.

Ultrasonic welding allows for fast bonding of thermoplastic polymer parts. The ultrasonic welding duration may be between 0.2 and 16 sec., preferably between 0.2 and 5.0 sec and even more preferably between 0.2 and 1 sec. The advantage of ultrasonic welding for joining the polymeric substrates together, in particular thermoplastic substrates, is that this method is much faster than conventional adhesives or solvents. The drying or solidification time after the welding is very quick and thus the welded devices do not need to remain in the ultrasonic welding device for long periods of time waiting for the joint to dry and cure.

The dimensions of the microfluidic channel and the shape thereof can be controlled by the ultrasonic welding conditions, in particular by the total energy, amplitude and sonotrode force, and the dimensions of the master form defined by the height of the rim protrusions as well as the distance of the rim protrusions in lengthwise direction and transverse direction.

The distance and the height of the rim protrusions depends on the size of the preformed microfluidic channels to be sealed or on the desired width and length of the microfluidic channels to be created. The distance of the rim protrusions in the transverse direction may be between several micrometers to several millimeters, for example from 50 to 4000 µm, preferably from between 500 to 3000 µm and more preferably between 800 and 2000 µm. The rim protrusions may have a height of from 100 to 1000 µm, preferably from 500 to 800 µm. The distance of the rim protrusions in the lengthwise direction defining the length of the microfluidic channel is not particularly limited, but may be from several micrometers to several centimeters, e.g. from 10 µm to 10 cm, from 50 µm to 9 cm, from 100 µm to 8 cm, from 200 µm to 7 cm, from 500 µm to 6 cm, from 1 mm to 5 cm, from 2 mm to 4 cm, from 5 mm to 3 cm, from 1 cm to 2 cm or from 1 mm to 1 cm.

In the embodiment, wherein the inflexible polymeric substrate already comprises preformed microfluidic channels, which are sealed by ultrasonically welding the flexible polymeric substrate and the inflexible polymeric substrate, the distance of the rim protrusions from the preformed microfluidic channels may be between 100 to 850 µm, preferably between 200 to 800 µm.

The shape of the sealed microfluidic channel is preferably rectangular as shown for example in FIG. 3. However, when welding the cover flexible polymeric substrate at a lower energy than the one needed to precisely seal the preformed microchannel comprised in the inflexible polymeric substrate, or when the metallic rim is relatively far from the preformed microfluidic channel, then the flexible polymeric substrate cover may form an interconnecting wider microfluidic channel on top of the preformed microfluidic channel, i.e. in total a T-shaped microfluidic channel is formed. Thus, it is also possible to form T-shaped microfluidic channels depending on the employed ultrasonic welding conditions and/or depending on the geometry of the rim protrusions in relation to the preformed microfluidic channel.

In the embodiment, where the microfluidic channels are created in the ultrasonic welding step d) the width of the microfluidic channels is mainly determined by the rim geometry of the master form. The width of the microfluidic channel may therefore be between several micrometers to several millimeters, for example from between 50 and 4000 µm, preferable between 500 and 3000 µm and more preferably between 800 and 2000 µm. The height of the microfluidic channels obtained by the method according to the present invention is mainly determined by the conditions applied for the ultrasonic welding and by the kind and thickness of the material used for the flexible polymeric material. The height of the microfluidic channels may be from 5 to 500 µm, preferably from 10 to 200 µm and more preferably from 10 to 150 µm. The length of the microfluidic channel is mainly determined by the rim geometry of the master form and is not particularly limited, but may be from several micrometers to several centimeters, e.g. from 10 µm to 10 cm, from 50 µm to 9 cm, from 100 µm to 8 cm, from 200 µm to 7 cm, from 500 µm to 6 cm, from 1 mm to 5 cm, from 2 mm to 4 cm, from 5 mm to 3 cm, from 1 cm to 2 cm or from 1 mm to 1 cm.

Figure 5:
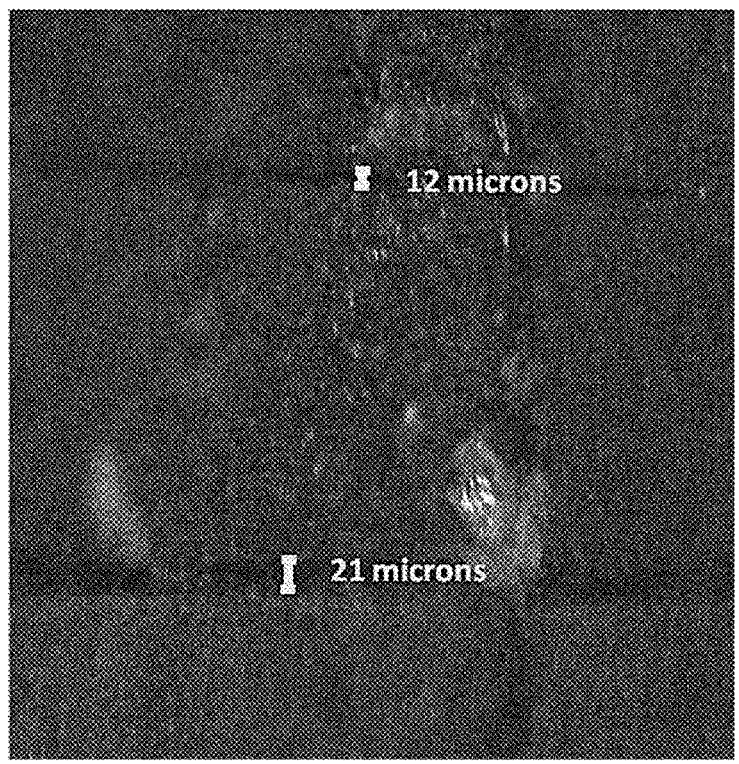
FIG. 5 shows an assembly of multilayered microfluidic channels.

By the method of the present invention, it is also possible to obtain a microfluidic device having multilayered microfluidic channels, i.e. microfluidic channels positioned on top of each other. In one embodiment two or more flexible polymeric substrates are placed onto the master form, wherein one flexible polymeric substrate is in contact with the rim protrusions in step b). One or more further flexible polymeric substrates are then placed onto the flexible polymeric substrate in contact with the rim protrusions of the master form. Then, the inflexible polymeric substrate is placed onto the two or more flexible polymeric substrates (step c)) and the three or more layers are ultrasonically welded in step d). Thereby, multilayered microfluidic channels are created. An example of such multilayered microfluidic channels is shown in FIG. 5 wherein two flexible PMMA foils were ultrasonically welded to an inflexible PMMA substrate to provide a two-story microfluidic channel network. The height of the microfluidic channels is about 21 μm and about 12 μm, respectively.

Preferably, the two or more flexible polymeric substrates have a glass transition temperature in the range of ±5° C. of each other and/or a melting temperature within ±5° C. of each other. Preferably, the two or more flexible polymeric substrates are made of the same material, even more preferably the two or more flexible polymeric substrates and the inflexible polymeric substrate are made of the same material such as PMMA or COP.

In an alternative embodiment a microfluidic device having multilayered microfluidic channels may be obtained by using as inflexible polymeric substrate in step c) a substrate which already encloses one or more microfluidic channels. The microfluidic channels may be multilayered in the inflexible substrate. Such an inflexible polymeric substrate already enclosing one or more microfluidic channels between at least two layers of polymeric material, i.e. sealed microfluidic channels may have been manufactured by the process of the present invention. Thus, in order to create a microfluidic device having multilayered microfluidic channels the claimed process simply needs to be repeated, i.e. the resulting product in step d) functions as the inflexible polymeric substrate in the repeated process.

The present invention provides a simple and time-efficient method for obtaining a microfluidic device comprising microfluidic channels via ultrasonically welding at least two polymeric substrates together without the use of energy directors. The method allows sealing of preformed microfluidic channels without deformation, melting or clogging of the existing microfluidic channels and allows to create microfluidic channels enclosed between at least two polymeric substrates.

The application further includes the following items:

Item 1. Method of manufacturing a microfluidic device comprising an inflexible polymeric substrate, one or more flexible polymeric substrate(s) and one or more microfluidic channel(s) enclosed between the substrates, the method comprising: a) providing a master form including rim protrusions which define an enveloping shape for the one or more microfluidic channel(s) to be produced and enclosed between the substrates, b) placing one or more flexible polymeric substrate(s) each having a layer thickness of less than 800 μm onto the master form, wherein one flexible polymeric substrate is in contact with the rim protrusions of the master form, c) placing an inflexible polymeric substrate with a layer thickness of equal to or more than 800 μm onto the one or more flexible polymeric substrate(s), and d) ultrasonically welding the one or more flexible polymeric substrate(s) and the inflexible polymeric substrate at the positions of the rim protrusions.

Item 2. Method according to item 1, wherein the inflexible polymeric substrate includes one or more preformed microfluidic channel(s) which are sealed by ultrasonically welding the flexible polymeric substrate(s) with the inflexible polymeric substrate in step d).

Item 3. Method according to item 1, wherein in step d) the flexible polymeric substrate is simultaneously deformed to create a microfluidic channel.

Item 4. Method according to anyone of items 1 to 3, wherein two or more flexible polymeric substrates are used in step d) to create multilayered microfluidic channels.

Item 5. Method according to item 4, wherein the two or more flexible polymeric substrates have a glass transition temperature in the range of ±5° C. of each other, and/or a melting point within ±5° C. of each other.

Item 6. Method according to anyone of items 1 to 5, wherein the inflexible polymeric substrate placed onto the flexible polymeric substrate in step c) comprises a polymeric material enclosing one or more microfluidic channel(s).

Item 7. Method according to anyone of items 1 to 6, wherein the master form comprises a metallic material, in particular aluminum or copper.

Item 8. Method according to anyone of items 1 to 7, wherein the inflexible polymeric substrate comprises a thermoplastic polymer such as poly(methyl methacrylate) (PMMA), cyclo olefin-copolymer (COC), cyclo olefin polymer (COP), polystyrene (PS), polyether ether ketone (PEEK), fluorinated ethylene propylene (FEP), polypropylene (PP), polyethylene (PE) and polycarbonate (PC).

Item 9. Method according to anyone of items 1 to 8, wherein the one or more flexible polymeric substrate(s) comprise(s) a thermoplastic polymer such as poly(methyl methacrylate) (PMMA), cyclo olefin copolymer (COC), cyclo olefin polymer (COP), polystyrene (PS), polyether ether ketone (PEEK), fluorinated ethylene propylene (FEP), polypropylene (PP), polyethylene (PE) and polycarbonate (PC).

Item 10. Method according to anyone of items 1 to 9, wherein the inflexible polymeric substrate and the one or more flexible polymeric substrate(s) are made of the same thermoplastic polymer.

Item 11. Method according to anyone of items 1 to 10, wherein the ultrasonic welding in step d) is carried out with a total energy of 50 J/cm$^2$ of rim area to 500 J/cm$^2$ of rim area, and/or an amplitude of 5 to 14 μm, and/or a sonotrode force of 150 to 650 N/cm$^2$ of rim area, and/or a welding duration of 0.2 to 16 sec.

Item 12. Method according to anyone of items 1 to 11, wherein the rim protrusions of the master form have a width of 50 to 2000 μm, and/or a height of 100 to 1000 μm.

Item 13. Method according to anyone of items 2 and 4 to 12, wherein the distance of the rim protrusions of the master form from the preformed microfluidic channels is between 100 to 850 μm.

Item 14. Method according to anyone of items 1 to 13, wherein the one or more microfluidic channel(s) have a width of 50 to 2000 μm and a height of 5 to 500 μm.

EXAMPLES

Example 1: Sealing of Preformed PMMA and COP Microfluidic Channels by Ultrasonic Welding This example describes sealing preformed microfluidic channels in an open microfluidic device for two different polymeric materials. In particular, this example relates to sealing a microfluidic channel in a PMMA inflexible substrate with a PMMA foil as flexible substrate and to sealing a microfluidic channel in a COP inflexible substrate with a COP foil as flexible substrate. The open microfluidic device can be fabricated by any means of polymer patterning method (CNC milling, lithography, lithography and dry etching, hot embossing, injection molding, etc.).

Microfluidic channels were created on a 2 mm thick PMMA substrate (inflexible polymeric substrate) and on a 2 mm thick COP substrate (inflexible polymeric substrate). Both substrates are considered inflexible due to their thickness of 2 mm. For both the PMMA substrate and the COP substrate the microfluidic channels were created by means of Computer Numerical Control (CNC) micromilling. In both inflexible substrates, the microfluidic channel width ranged from 100 to 500 µm and the channel height was approximately 300 µm.

The master from including the metallic rim protrusion was also fabricated by Computer Numerical Control (CNC) micromilling. The rim protrusion width was 1 mm. The distance in the lengthwise direction of the rim protrusions was 40 mm and the distance between the rim protrusions (transverse direction) was 2 mm so that the rim protrusions form an enveloping shape for the microfluidic channel to be sealed.

As flexible polymeric material a PMMA foil with a thickness of 300 µm or a COP foil with a thickness of 180 µm were used. Each flexible substrate is placed in contact with the metallic rim protrusion, the respective inflexible substrate is placed on top thereof and the flexible and inflexible substrates are ultrasonically welded at the rim position. Thereby, sealing of the enveloped microchannel is achieved. The method allows ultrasonic sealing of the microfluidic channels by bonding the thin, flexible substrate with the inflexible substrate without the use of energy directors and without distorting the microchannel dimension. The channel dimensions and shape are not altered after the ultrasonic welding step. Important parameters for the ultrasonic welding step are ultrasonic energy, amplitude and applied sonotrode force.

For the PMMA substrates typical conditions used during welding are Amplitude: 9.6 µm, Applied force: 450 N/cm² of rim area, and Ultrasonic energy: 140 to 170 J/cm² of rim area. For the COP substrates the conditions used in this example are Amplitude: 9 µm, Applied force: 380 N/cm² of rim area and Ultrasonic energy: 160-200 J/cm² of rim area. Sealing is achieved within one second of ultrasonic welding for both materials.

Figure 6:
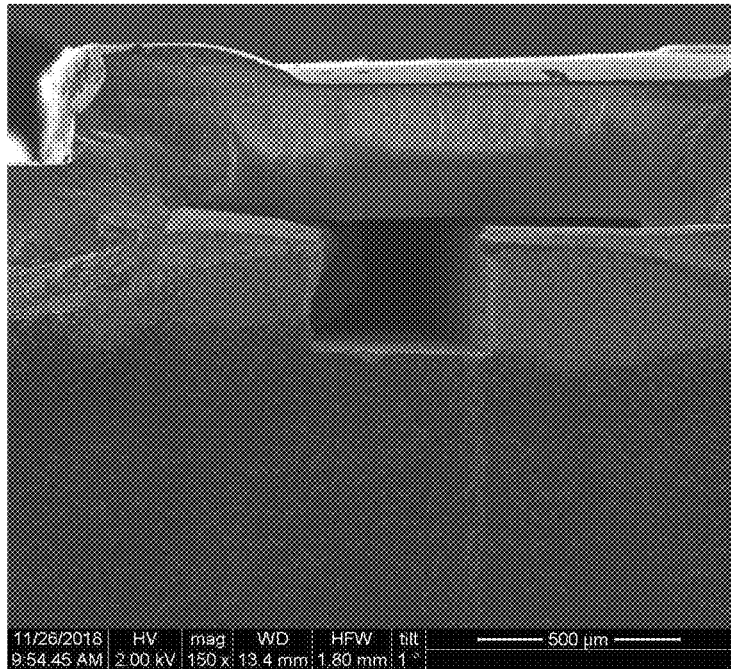
FIGS. 6(a) to (d) show examples of preformed microfluidic channels in PMMA substrates sealed by ultrasonic welding.
Figure 6:
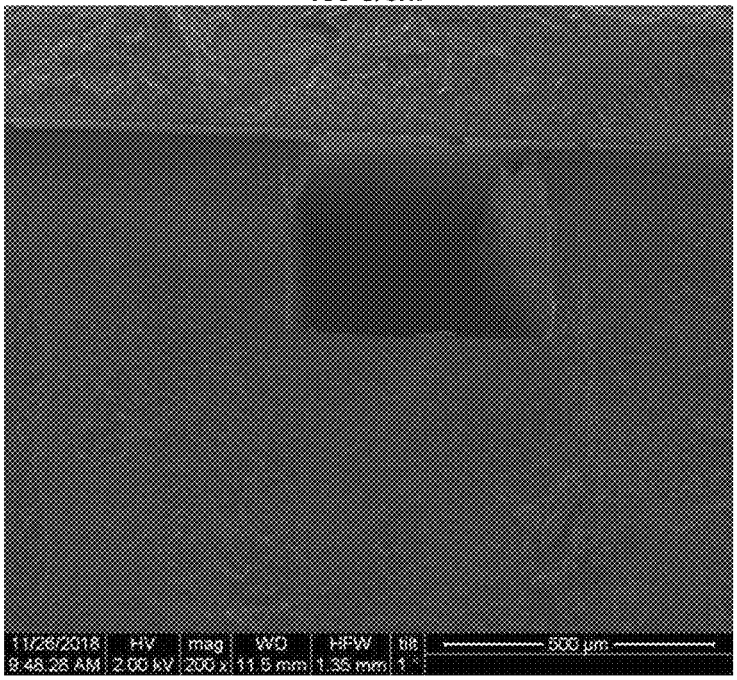
Figure 6:
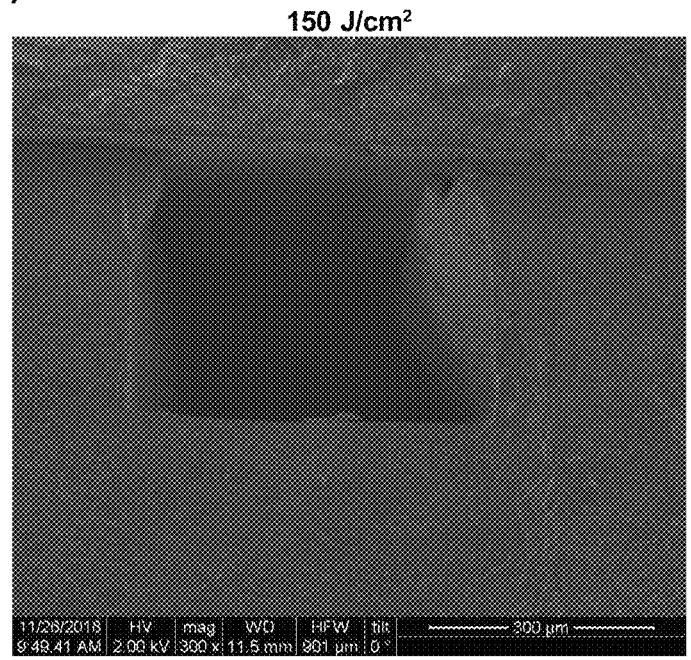
Figure 6:
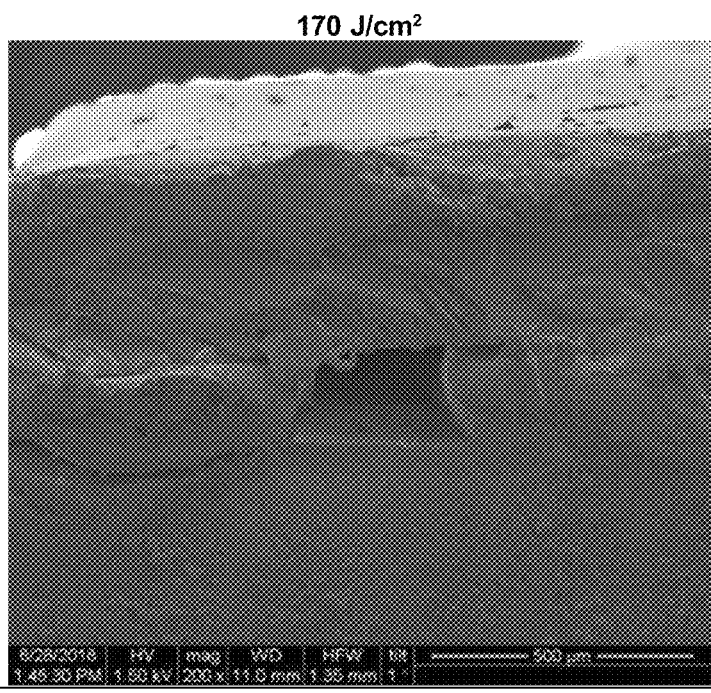
Figure 7:
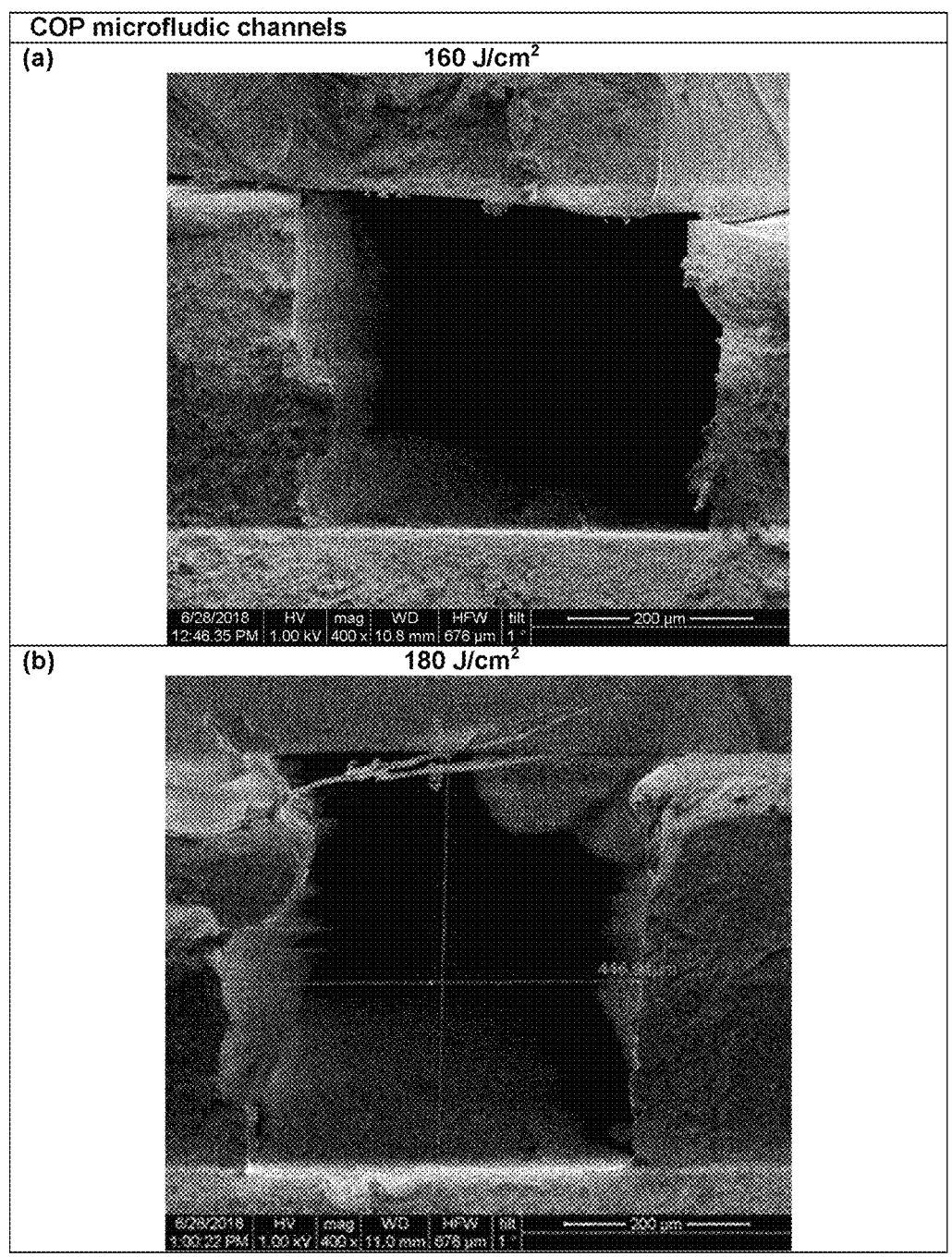
FIGS. 7(a) and (b) show examples of preformed microfluidic channels in COP substrates sealed by ultrasonic welding.

FIGS. 6 (a) to (d) (sealed PMMA microfluidic channels) and FIGS. 7 (a) and (b) (sealed COP microfluidic channels) illustrate examples of sealed, rectangular microfluidic channels in PMMA and COP substrates. For PMMA at 150 J/cm² of rim area a perfectly sealed microchannel is obtained (FIGS. 6(b),(c)). If excessive energy is used the channel is slightly deformed (PMMA 170 J/cm² of rim area, FIG. 6(d)), whereas low energy is not sufficient to accurately seal the microfluidic channel and a gap is observable between the inflexible substrate and the flexible cover (PMMA 140 J/cm² of rim area, FIG. 6(a); COP 160 J/cm² of rim area, FIG. 7(a)). It has to be noted that the deformation seen for COP at 180 J/cm² of rim area is mainly due to cutting the channel for observation of the cross-section image (FIG. 7(b)).

However, when bonding the cover flexible substrate at a lower energy than the one needed to precisely seal the bottom microfluidic channel, or when the metallic rim is positioned far from the preformed microfluidic channel, then the flexible cover forms an interconnecting wider microfluidic channel on top of the preformed microchannel as shown in FIG. 6(a) for 140 J/cm² of rim area for PMMA and in FIG. 7(a) for 160 J/cm² of rim area for COP. A T-shaped microfluidic channel is formed enclosed between the PMMA and COP substrates, respectively. Thus, by controlling the ultrasonic energy it is possible to form perfectly sealed microfluidic channels as well as T-shaped microfluidic channels.

Example 2: Manufacturing a Microfluidic Device Comprising an Inflexible Substrate, One Flexible Substrate and a Microfluidic Channel Enclosed Between the Inflexible Substrate and the One Flexible Substrate This example describes the rapid fabrication of microfluidic channels exemplified for two different polymeric materials. First, the flexible polymeric material and the inflexible polymeric material, both made of either PMMA or COP, are placed between the rim protrusions of the master from and the ultrasonic sonotrode. Then, in the ultrasonic welding step the flexible polymeric substrate in contact with the rim protrusions is deformed to create a bulging microfluidic channel. In this example, the rim protrusion width was 1 mm. The distance in the lengthwise direction of the rim protrusions was 40 mm. The distance between the rim protrusions (transverse direction) was 2 mm. The thin flexible PMMA substrate had a thickness of 300 µm and thin flexible COP substrate had a thickness of 180 µm. The thickness of the inflexible substrate was 2 mm for both the PMMA and COP inflexible substrate.

FIGS. 8(a),(b) and 9(a),(b) show SEM images of cross sections of the rapidly created bulging microfluidic channels for PMMA and COP. SEM Low magnification images are also provided, showing the channel cross-section (FIGS. 8(c) and 9(c)). The ultrasonic welding conditions used and the geometry of the rim protrusions determine the dimensions of the microchannel. For example, for the PMMA sample if the ultrasonic energy is increased from 140 J/cm² of rim area to 160 J/cm² of rim area the channel height decreases from 132 µm to 10 µm (Amplitude: 9.6 µm, Applied sonotrode force: 450 N/cm² of rim area). Using intermediate energy values, microfluidic channel heights ranging from 10 to 130 µm can be obtained. For the COP sample, when the ultrasonic energy is 180 J/cm² of rim area the microfluidic channel height is higher than 200 µm, whereas if energy is increased to 220 J/cm² of rim area the microfluidic channel height becomes 30 to 40 µm (Amplitude: 9 µm, Applied sonotrode force: 380 N/cm² of rim area).

The channel width is mainly determined by the rim geometry and can range from some micrometers up to several millimeters. A representative low magnification SEM image of a microchannel with a width of more than 1 mm is provided for both PMMA and COP substrates in FIGS. 8(c) and 9(c).

Example 3: Manufacturing of Bilayer Microfluidic Devices

The following example describes the fabrication of microfluidic devices comprising multilayered PMMA or COP microfluidic channels. In this example two microfluidic channels on top of each other were formed.

First, three polymeric substrates, i.e. one inflexible substrate and two flexible substrates of the same material were placed between the rim protrusions and the ultrasonic sonotrode. One of the flexible polymeric substrates is in contact with the rim protrusions, the other flexible polymeric substrate is positioned between the flexible polymeric material in contact with the rim protrusions and the inflexible polymeric material. During the ultrasonic welding step the two flexible polymeric substrates are deformed to create two bulging microfluidic channels which are positioned on top of each other. In this example, the rim protrusion width was 1 mm. The distance in the lengthwise direction of the rim protrusions was 40 mm and the distance between the rim protrusions (transverse direction) was 2 mm. The flexible polymeric substrates had a thickness of 300 µm for PMMA and a thickness of 180 µm for COP. The inflexible polymeric substrate had a thickness of 2 mm for both PMMA and COP.

Figure 10:
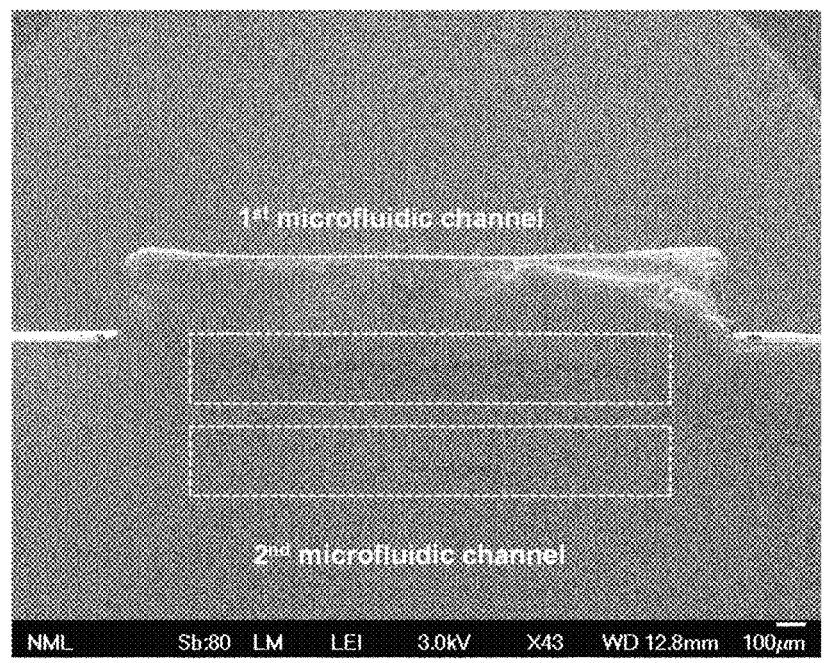
FIG. 10(a) shows an SEM image of the cross section of formed bilayer PMMA microfluidic channels.
FIG. 10(b) shows an SEM image of the cross section of formed bilayer PMMA microfluidic channels, wherein the applied total energy was increased compared to the sample shown in FIG. 10(a) resulting in closing of the shorter channel.
Figure 10:
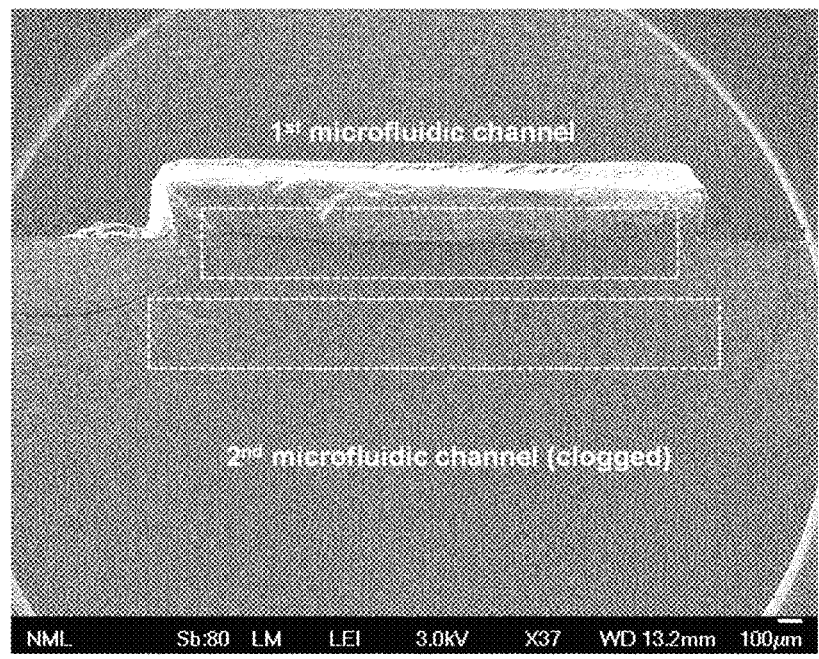

In the PMMA sample, two microfluidic channels are formed on top of each other by using an amplitude of 9.6 µm and a sonotrode force of 550 N/cm² of rim area as ultrasonic welding conditions. When applying a total energy of 150 J/cm² of rim area the two newly formed microfluidic channels have approximate heights of 10-30 µm as for example shown in FIG. 5. FIG. 10(*a*) shows a SEM image of the cross section of the formed bilayer PMMA microfluidic channels having dimensions comparable to those of FIG. 5 and obtained with energy ranging from 150-155 J/cm² of rim area. FIG. 10(*b*) shows an SEM image of the cross section of the formed bilayer PMMA microfluidic wherein the total energy has been increased to 160 J/cm² of rim area, wherein the first microfluidic channel has completely vanished as the flexible polymeric substrate layer is uniformly bonded to the inflexible polymeric substrate. Similar results were obtained for COP substrates using in the ultrasonic welding step an amplitude of 9 µm and a sonotrode force of 500 N/cm² of rim area. Thus, by controlling the ultrasonic welding conditions microfluidic devices comprising multilayered microfluidic channels can be obtained.

What is claimed is:

1. Method of manufacturing a microfluidic device comprising an inflexible polymeric substrate, one or more flexible polymeric substrate(s) and one or more microfluidic channel(s) enclosed between the substrates, the method comprising:
   a) providing a master form including rim protrusions which define an enveloping shape for the one or more microfluidic channel(s) to be produced and enclosed between the substrates,
   b) placing one or more flexible polymeric substrate(s) each having a layer thickness of less than 800 µm onto the master form, wherein one flexible polymeric substrate is in contact with the rim protrusions of the master form,
   c) placing an inflexible polymeric substrate with a layer thickness of equal to or more than 800 µm onto the one or more flexible polymeric substrate(s), and
   d) ultrasonically welding the one or more flexible polymeric substrate(s) and the inflexible polymeric substrate at the positions of the rim protrusions, wherein at the same time bonding of the substrates at the rim protrusions takes place the flexible polymeric substrate deforms into the cavity of the master form defined by the boundaries of the rim protrusions to create a microfluidic channel, and
   wherein the inflexible polymeric substrate and the one or more flexible polymeric substrate(s) prior the ultrasonic welding step d) are flat.

2. Method according to claim 1, wherein two or more flexible polymeric substrates are used in step d) to create multilayered microfluidic channels.

3. Method of manufacturing a microfluidic device comprising an inflexible polymeric substrate, two or more flexible polymeric substrates and microfluidic channels enclosed between the substrates, the method comprising:
   a) providing a master form including rim protrusions which define an enveloping shape for the microfluidic channels to be produced and enclosed between the substrates,
   b) placing two or more flexible polymeric substrates each having a layer thickness of less than 800 µm onto the master form, wherein one flexible polymeric substrate is in contact with the rim protrusions of the master form,
   c) placing an inflexible polymeric substrate with a layer thickness of equal to or more than 800 µm onto the two or more flexible polymeric substrates, and
   d) ultrasonically welding the two or more flexible polymeric substrates and the inflexible polymeric substrate at the positions of the rim protrusions,
   wherein the inflexible polymeric substrate includes one or more preformed microfluidic channel(s) which are sealed by ultrasonically welding the flexible polymeric substrates with the inflexible polymeric substrate in step d) and wherein by using two or more flexible polymeric substrates in step d) which deform into the cavity of the master form defined by the boundaries of the rim protrusions at the same time bonding of the substrates at the rim protrusions takes place multilayered microfluidic channels are created.

4. Method according to claim 2, wherein the two or more flexible polymeric substrates have a glass transition temperature in the range of ±5° C. of each other, and/or a melting point within ±5° C. of each other.

5. Method according to claim 1, wherein the master form comprises a metallic material, in particular aluminum or copper.

6. Method according to claim 1, wherein the inflexible polymeric substrate comprises a thermoplastic polymer such as poly (methyl methacrylate) (PMMA), cyclo olefin-copolymer (COC), cyclo olefin polymer (COP), polystyrene (PS), polyether ether ketone (PEEK), fluorinated ethylene propylene (FEP), polypropylene (PP), polyethylene (PE) and polycarbonate (PC).

7. Method according to claim 1, wherein the one or more flexible polymeric substrate(s) comprise(s) a thermoplastic polymer such as poly (methyl methacrylate) (PMMA), cyclo olefin copolymer (COC), cyclo olefin polymer (COP), polystyrene (PS), polyether ether ketone (PEEK), fluorinated ethylene propylene (FEP), polypropylene (PP), polyethylene (PE) and polycarbonate (PC).

8. Method according to claim 1, wherein the inflexible polymeric substrate and the one or more flexible polymeric substrate(s) are made of the same thermoplastic polymer.

9. Method according to claim 1, wherein the ultrasonic welding in step d) is carried out with a total energy of 50 J/cm² of rim area to 500 J/cm² of rim area, and/or an amplitude of 5 to 14 µm, and/or a sonotrode force of 150 to 650 N/cm² of rim area, and/or a welding duration of 0.2 to 16 sec.

10. Method according to claim 1, wherein the rim protrusions of the master form have a width of 50 to 2000 µm, preferably of 1000 to 2200 µm, and/or a height of 100 to 1000 µm.

11. Method according to claim 3, wherein the distance of the rim protrusions of the master form from the preformed microfluidic channels is between 100 to 850 µm.

12. Method according to claim 1, wherein the one or more microfluidic channel(s) have a width of 50 to 2000 μm and a height of 5 to 500 μm.

* * * * *